United States Patent
Kang et al.

(10) Patent No.: US 11,309,870 B2
(45) Date of Patent: Apr. 19, 2022

(54) FIELD EFFECT TRANSISTOR (FET) CONFIGURED TO PHASE SHIFT A RADAR SIGNAL USING FIRST AND SECOND VARIABLE VOLTAGES APPLIED TO A GATE AND A BACK GATE OF THE FET

(71) Applicant: GM GLOBAL TECHNOLOGY OPERATIONS LLC, Detroit, MI (US)

(72) Inventors: Jongchang Kang, Moorpark, CA (US); Ara Kurdoghlian, La Canada, CA (US); Mehran Mokhtari, Tarzana, CA (US); Igal Bilik, Rehovot (IL)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 57 days.

(21) Appl. No.: 16/945,438

(22) Filed: Jul. 31, 2020

(65) Prior Publication Data

US 2022/0037752 A1    Feb. 3, 2022

(51) Int. Cl.
| | |
|---|---|
| *H03H 11/20* | (2006.01) |
| *H01P 1/18* | (2006.01) |
| *H01Q 3/36* | (2006.01) |
| *H01P 1/185* | (2006.01) |
| *H03H 11/16* | (2006.01) |

(52) U.S. Cl.
CPC .............. *H03H 11/20* (2013.01); *H01P 1/18* (2013.01); *H01P 1/185* (2013.01); *H01Q 3/36* (2013.01); *H03H 11/16* (2013.01)

(58) Field of Classification Search
CPC ........... H01P 1/185; H01P 1/18; H03H 11/20; H03H 11/16; H01Q 3/36
USPC .......................... 333/164, 138; 327/581, 237
See application file for complete search history.

(56) References Cited

U.S. PATENT DOCUMENTS

| | | | | |
|---|---|---|---|---|
| 4,638,190 A | * | 1/1987 | Hwang et al. ......... | H03H 11/20 327/237 |
| 4,647,789 A | * | 3/1987 | Upadhyayula ......... | H03H 11/20 327/240 |

* cited by examiner

*Primary Examiner* — Benny T Lee
(74) *Attorney, Agent, or Firm* — Lorenz & Kopf LLP

(57) ABSTRACT

The present application relates to a method and apparatus for implementing a radar array including a gate bias source for providing a first variable voltage, a back gate well control for providing a second variable voltage, and a field effect transistor having a drain, a source, a gate and a back gate well control, the field effect transistor being further configured to couple an alternating current radar signal between the drain and the source and to adjust a phase of the alternating current radar in response to first variable voltage applied to the gate and the second variable voltage applied to the back gate well control.

20 Claims, 6 Drawing Sheets

FIELD EFFECT TRANSISTOR (FET) CONFIGURED TO PHASE SHIFT A RADAR SIGNAL USING FIRST AND SECOND VARIABLE VOLTAGES APPLIED TO A GATE AND A BACK GATE OF THE FET

BACKGROUND

The present disclosure relates generally to radar sensor systems. More specifically, aspects of this disclosure relate to systems, methods and devices to implement a low loss phase shift in an FET based on-chip radar by adjusting an effective capacitance of drain-to-body and/or source-to-body through the back-gate node of FET.

Certain vehicles today utilize radar systems. For example, certain vehicles utilize radar systems to detect other vehicles, pedestrians, or other objects on a road in which the vehicle is travelling. Radar systems may be used in this manner, for example, in implementing automatic braking systems, adaptive cruise control, and avoidance features, among other vehicle features. Certain vehicle radar systems, such as multiple input, multiple output (MIMO) radar systems, have multiple transmitters and receivers configured in a phased array or an electronically scanned array. A phased array radar system may steer the radar in different directions without physically moving the antennas by adjusting the individual phases of each of the transmitted signals. While radar systems are generally useful for such vehicle features, in certain situations existing radar systems may have certain limitations.

Vehicular radar systems require high performance, low maintenance and low cost to accommodate implementation in consumer vehicles. To achieve these goals, multiple phased array radars may be employed on the vehicle with each radar having a certain range of angle of operation. Currently, integrated circuit (IC) based radar systems are being developed to reduce the complexity and increase the durability of these vehicle based radar systems. Most of the IC level radars perform phase shifting by switching on/off capacitor banks or via different true-time delay lines selection. As a general switching device, field effect transistors (FET) or Micro-Electro-Mechanical Systems (MEMS) switches are used. In case of MEMS switch, the bulky size can be a trouble for a compact IC design and high-voltage based actuation and relatively slow switching speed limits its general application. So, phase shifters which use an FET switch are generally popular for a compact IC application. However, FET switching speed limits and poor isolation at high frequency (beyond mm-wave) poses high insertion loss problem and maximum application frequency limit. Electrical FET based switches also pose nonlinear harmonic generation against high power. So, as power requirement increases, FET size also has to be increased, thereby resulting in the need for additional matching networks and switching isolation related problems. Capacitor bank switching based phase shifter may also be prone to capacitor process variation and improper for fine-resolution tuning phase shifting. It would be desirable to overcome these problems to provide a low loss and fine resolution tuning phase shifter for radio frequency or millimeter wave range applications.

The above information disclosed in this background section is only for enhancement of understanding of the background of the invention and therefore it may contain information that does not form the prior art that is already known in this country to a person of ordinary skill in the art.

SUMMARY OF THE INVENTION

Disclosed herein are various solid state electromagnetic sensing systems and related control logic for provisioning vehicle sensor systems, methods for making and methods for operating such systems, and motor vehicles equipped with onboard sensor and control systems. By way of example, and not limitation, there is presented an automobile with onboard vehicle array radar transmitters and receivers and corresponding control systems.

In accordance with an aspect of the present disclosure, a radar array including a gate bias source for providing a first variable voltage, a back gate bias source for providing a second variable voltage, and a field effect transistor having a drain, a source, a gate and a back gate well control, the field effect transistor being further configured to couple an alternating current radar signal between the drain and the source and to adjust a phase of the alternating current radar signal in response to the first variable voltage applied to the gate and the second variable voltage applied to the back gate well control.

In accordance with another aspect of the present disclosure, a substrate and wherein the field effect transistor is formed within the substrate and wherein the field effect transistor has a drain to body capacitance between the drain and the substrate and wherein adjusting the first variable voltage and the second variable voltage modifies the capacitance of the drain to body capacitance.

In accordance with another aspect of the present disclosure, a preamplifier for adjusting a magnitude of the radar signal and coupling the radar signal to the source.

In accordance with another aspect of the present disclosure, an amplifier for receiving the radar signal from the drain, adjusting a magnitude of the radar signal and coupling the radar signal to a radar antenna.

In accordance with another aspect of the present disclosure wherein the radar array includes a plurality of antennas and wherein each of the antennas is coupled to one of a plurality of phase shifters.

In accordance with another aspect of the present disclosure wherein the radar signal is a millimeter wave radar signal.

In accordance with another aspect of the present disclosure, an insulator well formed between the field effect transistor and a substrate and wherein the insulator well has an insulator well to substrate capacitance forming a portion of a drain to substrate capacitance and second variable voltage applied at the back gate well control alters the insulator well to substrate capacitance.

In accordance with another aspect of the present disclosure wherein the second variable voltage is applied to the back gate well control via a radio frequency choke resistor.

In accordance with another aspect of the present disclosure, a method of altering a phase of a radar signal by a field effect transistor formed on a substrate including receiving the radar signal at a source of the field effect transistor, applying a first variable voltage to a gate of the field effect transistor, applying a second variable voltage to a back gate well control such that the phase of the radar signal is adjusted to a desired phase, and transmitting the radar signal having the desired phase from a drain of the field effect transistor.

In accordance with another aspect of the present disclosure wherein varying the second variable voltage varies a drain to body capacitance between the drain and the substrate.

In accordance with another aspect of the present disclosure including adjusting a magnitude of the radar signal by a preamplifier and coupling the radar signal to the source.

In accordance with another aspect of the present disclosure, including adjusting, by an amplifier a magnitude of the radar signal having the desired phase and coupling the radar signal to a radar antenna.

In accordance with another aspect of the present disclosure, wherein the field effect transistor is one of a plurality of field effect transistors and wherein the plurality of field effect transistors form a portion of a radar array.

In accordance with another aspect of the present disclosure, wherein the radar signal is a millimeter wave radar signal.

In accordance with another aspect of the present disclosure, wherein the field effect transistor is formed on an insulator well formed within a substrate and wherein the insulator well has an insulator well to substrate capacitance forming a portion of a drain to substrate capacitance and second variable voltage applied at the back gate well control alters the insulator well to substrate capacitance.

In accordance with another aspect of the present disclosure, wherein the second variable voltage is applied to the back gate well control via a switched DC bias source.

In accordance with another aspect of the present disclosure, a solid state radar array including a first radar signal channel including a first antenna, a first amplifier, and a first bandpass filter, and a second radar signal channel including a second antenna, a second amplifier, a second bandpass filter, and a phase shifter wherein the phase shifter includes a field effect transistor having a drain, a source, a gate and a back gate well control, the field effect transistor being configured to couple a first alternating current radar signal between the drain and the source and to adjust a phase of the first alternating current radar signal in response a first variable voltage from a gate bias source applied to the gate and the second variable voltage from a back gate control source applied to the back gate well control.

In accordance with another aspect of the present disclosure, wherein the first antenna is configured to receive a second alternating current radar signal and the second antenna is configured to receive the first alternating current radar signal and wherein the phase shifter is configured to adjust the phase of the first alternating current radar signal to match a phase of the second alternating current radar signal.

In accordance with another aspect of the present disclosure, wherein the first antenna is configured to transit a second alternating current radar signal and the second antenna is configured to transmit the first alternating current radar signal and wherein the phase shifter is configured to adjust the phase of the first alternating current radar signal to alter a directivity of the solid state radar array.

In accordance with another aspect of the present disclosure, wherein the first amplifier, the first bandpass filter; the second amplifier, the second bandpass filter and the phase shifter are formed as an integrated circuit.

The above advantage and other advantages and features of the present disclosure will be apparent from the following detailed description of the preferred embodiments when taken in connection with the accompanying drawings.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings.

The exemplifications set out herein illustrate preferred embodiments of the invention, and such exemplifications are not to be construed as limiting the scope of the invention in any manner.

DETAILED DESCRIPTION OF THE INVENTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting but are merely representative. The various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
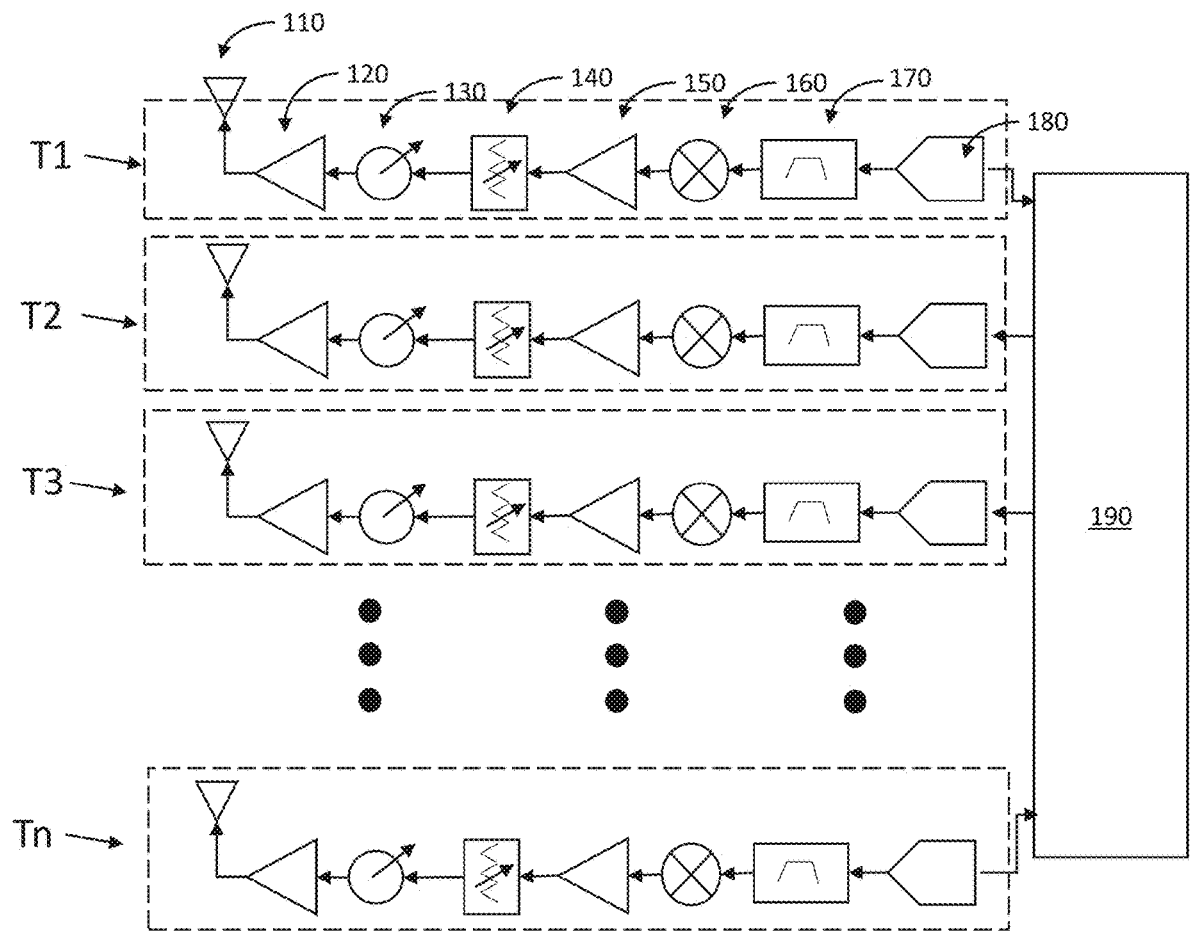
FIG. 1 shows an operating environment for a field effect transistor phase shifter in a radar system according to an exemplary embodiment.

FIG. 1 schematically illustrates an operating environment for a field effect transistor phase shifter in a radar system. In this exemplary embodiment of the present disclosure, a typical configuration for an analog beamformer 100 for a phased array radar is shown. The exemplary analog beamformer 100 is illustrated as a radar transmitter, but a similar structure may be employed for an analog beamformer for a radar detector. The exemplary analog beamformer 100 may include a plurality of transmission channels T1, T2, T3 . . . Tn each employing independent phase and amplitude control.

Each of the plurality of transmission channels T1, T2, T3 . . . Tn in the exemplary analog beamformer 100 may include an antenna 110, an amplifier 120, a phase shifter 130, an attenuator 140, a preamplifier 150, a mixer 160, a bandpass filter 170, and a digital to analog converter 180. The analog beamformer 100 may also include digital circuitry 190 such as a digital signal processor, equalizers, digital filters and the like. In this exemplary embodiment, the antenna 110 in each of the plurality of transmission channels T1, T2, T3 . . . Tn is in a fixed position. In a phased array transmitter, the beam direction of the radar is electronically scanned by adjusting the phase of each of the transmitted signals using the phase shifter 130, attenuator 140 and preamplifier 150 such that the radiation amplitude is increased in a desired direction and suppressed in undesired directions.

The exemplary phase shifter 130 is configured using FET structures to enable low-loss and fine resolution tuning phase shifter for RF or mm-wave range application by utilizing body capacitance variation of the FET. The FET with body capacitance variation may also enable phase magnitude and resolution adjustment by adjusting an external bias control. Since the exemplary phase shifter 130 is adjusted in response to FET body capacitance, the phase shifter 130 may generate less non-linear harmonics than any other electrical transistor switching based phase shifters. In an alternate embodiment for a radar transmitter, the phase shifter 130 may be added at the input of the stage, before the up-conversion at an intermediate frequency so that the phase-shift range is increased proportional to a radio frequency over intermediate frequency ratio. In this embodiment, large phase shift ranges may be achieved at very high frequencies, such as sub-Terahertz frequencies.

In one exemplary embodiment, the radar signal is coupled to the phase shifter 130 includes a transmission line between an input and an output. The transmission line, in appropriate places, is loaded with FET-transistors. The FET transistors gates are provided with suitable bias. In an analog control application, the FET transistors' back-gate (BG) terminal is connected to a Tunable DC-source. In a digital switch controlled application, the BG node may be connected to a switch transistor and a load to ground/bias to change the impedance of the line by introducing a different load in series with its source. Advantageously, this phase-shifter topology has negligible power dissipation such that the only sources of power dissipation are originating from the gate/BG-currents.

Figure 2:
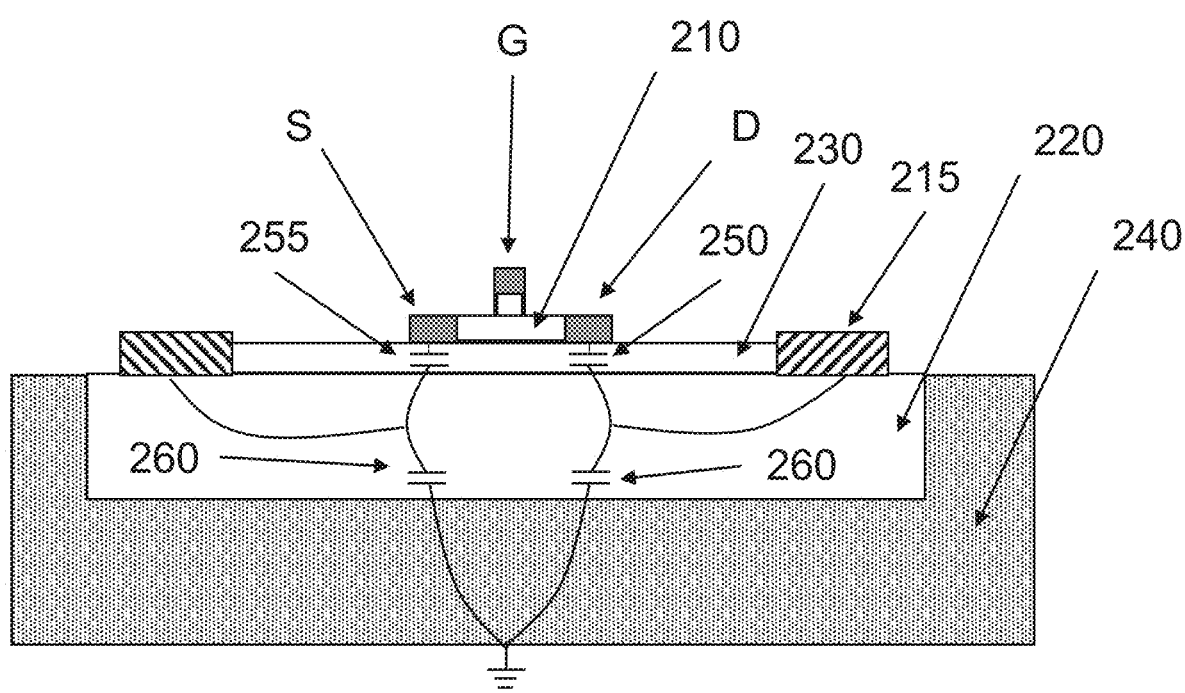
FIG. 2 shows a block diagram illustrating a field effect transistor phase shifter in a radar system according to an exemplary embodiment.

Turning now to FIG. 2, a diagram illustrating an exemplary implementation of an FET 200 with back gate control for use in a phased array radar is shown. The exemplary FET 200 includes a source S, a gate G, a drain D, a semiconductor layer 210, an insulator layer 230, a back gate well control 215, an insulator well 220, a substrate 240, a source well capacitance 255, a drain well capacitance 250, and an insulator well substrate capacitance 260. The exemplary FET 200 is used as a phase shifter by manipulating the back-gate of the device is accessible for manipulation in order to change the effective drain-to-body capacitance and/or source-to-body capacitance with an analog voltage or digital switching control through the back gate well control 215. The effective drain-to-body capacitance is a combination of the drain well capacitance 250 and the well substrate capacitance 260. The effective source-to-body capacitance is a combination of the source well capacitance 255 and the well to substrate capacitance 260.

Figure 3A:
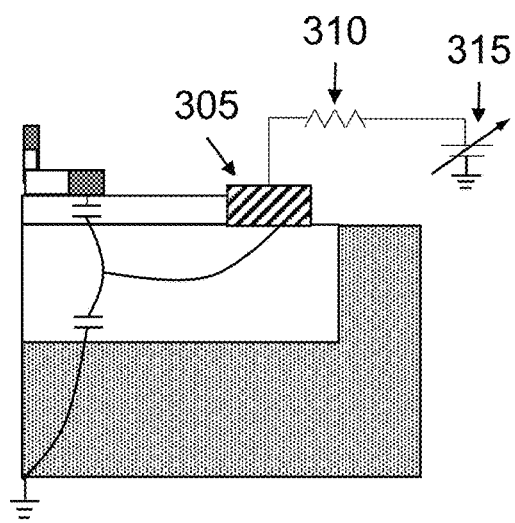
FIG. 3a shows a diagram illustrating a floated back-gate bias control in an FET for phase shifting in a phased array radar according to another exemplary embodiment.

Turning now to FIG. 3a, a diagram illustrating a floated back-gate bias control in an FET for phase shifting in a phased array radar is shown. In this exemplary embodiment, a variable back gate bias 315 is applied to the back gate well control 305 through a resistor 310. The resistance value may be chosen such that the resistor 310 provides a radio frequency choke resistance. The effective drain-to-body capacitance and can be tuned by adjusting the variable back-gate bias 315. In this configuration, the effective drain-to-body capacitance is approximately the drain to well capacitance in series with the well to substrate capacitance.

In another exemplary embodiment, if the resistance of the resistor 310 is zero thereby creating a short circuit between the variable back gate bias 315 and the back gate well control 305, the back-gate node effectively introduces an AC ground. This configuration provides an AC shorted back-gate bias control resulting in an effective AC drain to body capacitance approximately equal to the drain to well capacitance which can be adjusted by the variable back gate bias 315. The well to substrate capacitance is minimal in this configuration.

Figure 3B:
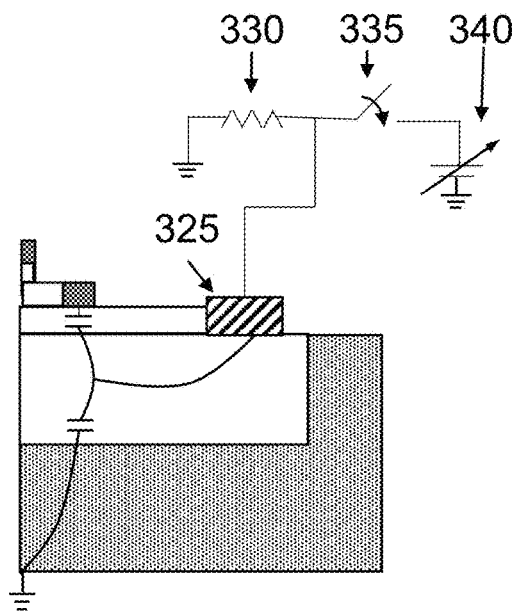
FIG. 3b shows a diagram illustrating a switched back-gate bias control in an FET for phase shifting in a phased array radar according to another exemplary embodiment.

Turning now to FIG. 3b, a diagram illustrating a switched back-gate bias control in an FET for phase shifting in a phased array radar is shown. The floated back-gate bias control configuration includes a resistor 330 having a resistance, a switch 335 a back gate well control 325 and a variable back gate bias 340. Back-gate potential can be switched between ground and open by switching the switch 335. This switch 335 may be a transistor (FET or BJT) switch or MEMS if necessary. When switch 335 is off, back-gate is floated resulting in a drain to body effective capacitance approximately equal to the drain well capacitance in series with the well substrate capacitance effective. The resistor 330 may be employed to discharge any accumulated charge on well while the switch 335 is off. When the switch 335 is on, back gate well control 325 is connected to ground resulting in a drain to body effective capacitance approximately equal to the drain well capacitance.

Figure 3C:
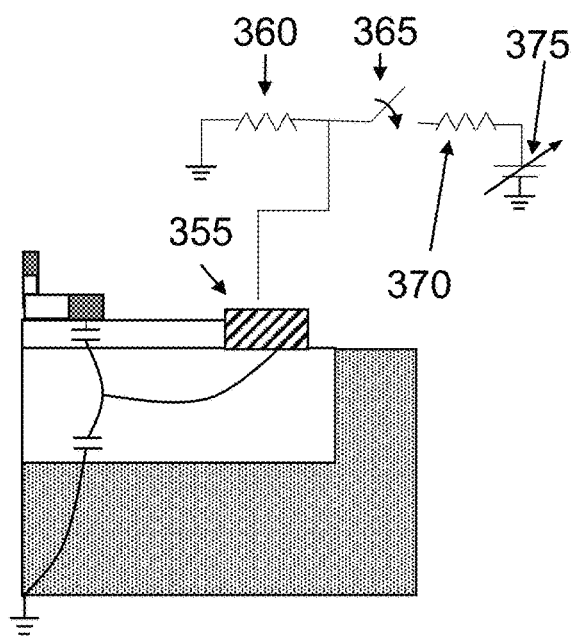
FIG. 3c a diagram illustrating a switched floated back-gate bias control in an FET for phase shifting in a phased array radar according to another exemplary embodiment.

Turning now to FIG. 3c, a diagram illustrating a switched floated back-gate bias control in an FET for phase shifting in a phased array radar is shown. The switched floated back-gate bias control configuration includes a first resistor 360 having a first resistance, a second resistor 370 having a second resistance, a switch 365, a back gate well control 355 and a variable back gate bias 375. The back gate potential can be switched between open and floated back-gate bias control. When switch 365 is off, back gate well control 355 is floated resulting in a drain to body effective capacitance approximately equal to the drain well capacitance in series with the well substrate capacitance. Discharging the first resistor 360 may discharge any accumulated charge on well while the switch 365 is off. When switch 365 is on, the back gate well control 355 is connected to the variable back gate bias 375 and the drain to body effective capacitance is about equal to the drain well capacitance in series with the well substrate capacitance and can be adjusted by variable back gate bias 375.

Figure 3D:
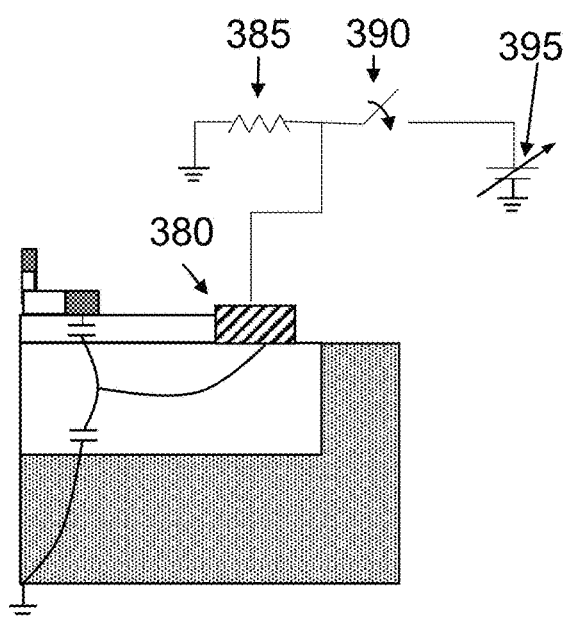
FIG. 3d shows a diagram illustrating a switched A/C shorted back-gate bias control in an FET for phase shifting in a phased array radar according to another exemplary embodiment.

Turning now to FIG. 3d, a diagram illustrating a switched A/C shorted back-gate bias control in an FET for phase shifting in a phased array radar is shown. The floated back-gate bias control configuration includes a resistor 385 having a resistance, a switch 390, a back gate well control 380 and a variable back gate bias 395. In this exemplary embodiment, back-gate potential can be switched between open and A/C shorted back-gate bias control. When the switch 390 is in the open position, the back-gate is floated and drain to body effective capacitance is about equal to the drain well capacitance in series with the well substrate capacitance. The resistor 385 may be used to discharge any accumulated charge on the back gate well control 380 during the switch opening. When switch 390 is in the closed position, the back gate well control 380 is connected to variable back gate bias 395 and effective A/C drain to body effective capacitance is about equal to the drain well capacitance and can be adjusted by the variable back gate bias 395.

Figure 4:
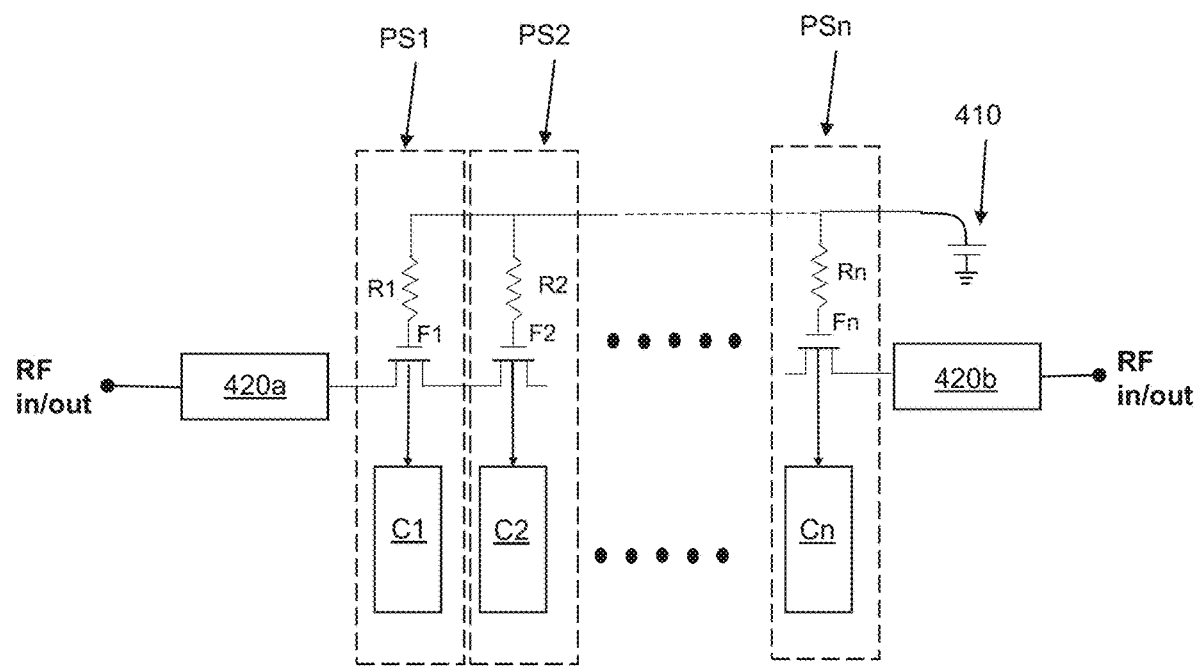
FIG. 4 shows a diagram illustrating an exemplary embodiment of an N-state phase shifter according to another exemplary embodiment.

Turning now to FIG. 4, a diagram illustrating an exemplary embodiment of an N-state phase shifter is shown. The exemplary phase shifter 400 may include a first impedance matching circuit 420*a* coupled to a first RF input/output, a second impedance matching circuit 420*b* coupled to a second RF input/output, a variable gate bias 410, and a plurality of phase shifting circuits PS1, Ps2 . . . PSn. In this exemplary embodiment, each of the plurality of phase shifting circuits PS1, Ps2 . . . PSn includes a resistor R1, R2, . . . Rn, an FET device F1, F2 . . . Fn, and a back gate control C1, C2, . . . Cn. In this exemplary embodiment, the resistors R1, R2, . . . Rn are configured as RF choke resistors. By cascading the FET devices R1, R2, . . . Rn in series, the n-state phase shifter can be implemented by manipulating each back gate control. The back gate control C1, C2, . . . Cn may be configured in one of the configurations discussed with respect to FIGS. 3*a*, 3*b*, 3*c* and 3*d*.

In an exemplary millimeter wave system, each of the plurality of phase shifting circuits Ps1, Ps2, . . . PSn may be connected between each section of the microstrip or stripline. The source and drain of each FET device F1, F2 . . . Fn may be tied together. The phase of the propagating wave is then determined in response to the capacitance value of the back-gate controlled FET devices F1, F2 . . . Fn. Depending on the impedance of the transmission line between the phase shifters Ps1, Ps2, . . . Psn the first impedance matching circuit 420*a* and/or the second impedance matching circuit 420*b* may be optional.

Figure 5:
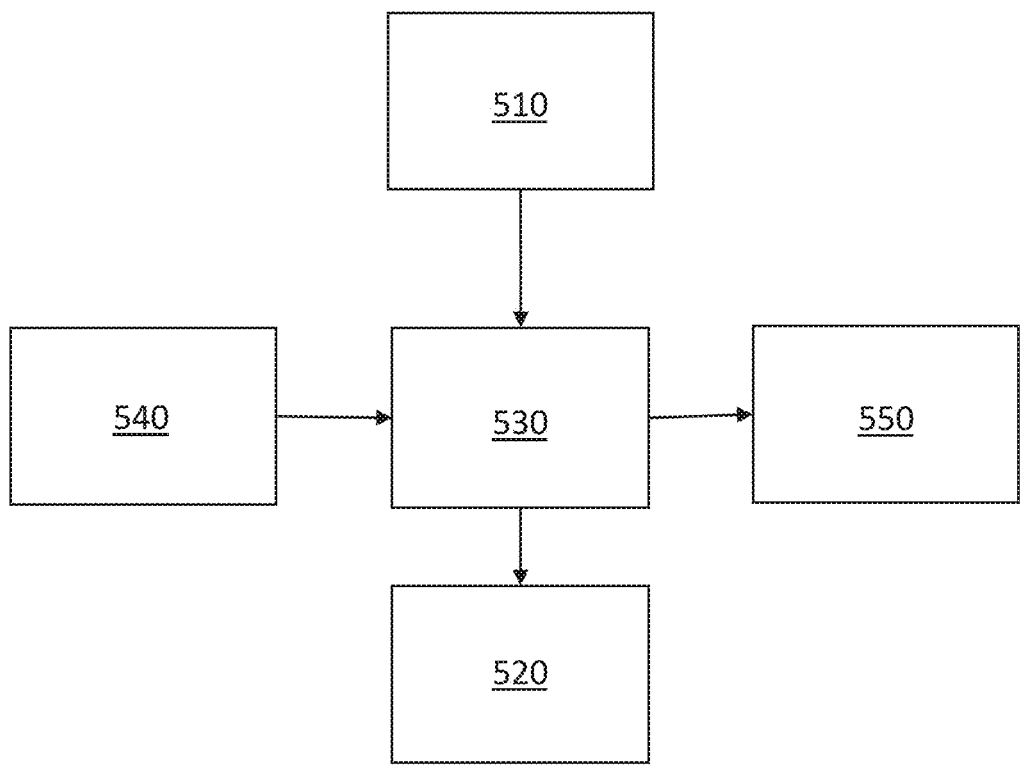
FIG. 5 shows a block diagram illustrating another field effect transistor phase shifter in a radar system according to another exemplary embodiment.

Turning now to FIG. 5, a block diagram illustrating an exemplary implementation of a phase shifter 500 for a radar array is shown. The exemplary phase shifter 500 may include a gate bias source 510, a back gate bias source 520, a field effect transistor 530, a preamplifier 540 and an amplifier 550.

In this exemplary embodiment, the gate bias source 510 is configured for providing a first variable voltage to a gate of the FET 530. The gate bias voltage provided by the gate bias source 510 is functional to provide a conduction path between a drain and a source of the FET 530.

The back gate bias source 520 is configured for providing a second variable voltage to a back gate well control of the FET 530. The second variable voltage is functional to adjust a drain to body capacitance between the drain of the FET 530 and a substrate. In one exemplary configuration, the second variable voltage is applied to the back gate well control via a radio frequency choke resistor.

The FET 530 is configured as a phase shifting device having a drain, a source, a gate and a back gate well control, the field effect transistor being further configured to couple an alternating current radar signal between the drain and the source and to adjust a phase of the alternating current radar signal in response to the first variable voltage applied to the gate and the second variable voltage applied to the back gate well control. The FET 530 may be formed on or within a substrate such that the FET 530 has a drain to body capacitance between the drain and the substrate. Thus, adjusting the first variable voltage and the second variable voltage modifies the capacitance of the drain to body capacitance. In one exemplary embodiment, the radar signal is a millimeter wave radar signal, such as millimeter wave signal having a frequency of 240 GHz.

The exemplary radar array may further include a preamplifier 540 for adjusting a magnitude of the radar signal and coupling the radar signal to the source of the FET 530 and an amplifier 550 for receiving the radar signal from the drain of the FET and adjusting a magnitude of the radar signal and coupling the radar signal to a radar antenna. In addition, the radar array may be coupled to a plurality of antennas and wherein each of the antennas is coupled to one of a plurality of phase shifters.

In one exemplary application, the FET 530 may include including an insulator well formed between the FET 530 and a substrate. The insulator well may have an insulator well to substrate capacitance forming a portion of a drain to substrate capacitance and second variable voltage applied at the back gate well control alters the insulator well to substrate capacitance.

In one exemplary embodiment, the exemplary phase shifter 500 may form a portion of a solid state radar array including a first radar signal channel including a first antenna, a first amplifier, and a first bandpass filter and a second radar signal channel including a second antenna, a second bandpass filter, and the phase shifter 500. The phase shifter may include an FET 530 having a drain, a source, a gate and a back gate well control. The FET 530 may be then configured to couple a first alternating current radar signal between the drain and the source and to adjust a phase of the first alternating current radar signal in response to a first variable voltage from a gate bias source 510 applied to the gate and the second variable voltage from a back gate bias source 520 applied to the back gate well control. In one exemplary embodiment, the first amplifier, the first bandpass filter, the second bandpass filter and the phase shifter may be formed as an integrated circuit.

In a radar receiver configuration, the first antenna may be configured to receive a second alternating current radar signal and the second antenna is configured to receive the first alternating current radar signal. The exemplary phase shifter 500 may then be configured to adjust the phase of the first alternating current radar signal to match a phase of the second alternating current radar signal.

In a transmitter configuration, the first antenna may be configured to transit a second alternating current radar signal and the second antenna is configured to transmit the first alternating current radar signal. In this case, the phase shifter 500 may be configured to adjust the phase of the first alternating current radar signal to alter a directivity of the solid state radar array.

Figure 6:
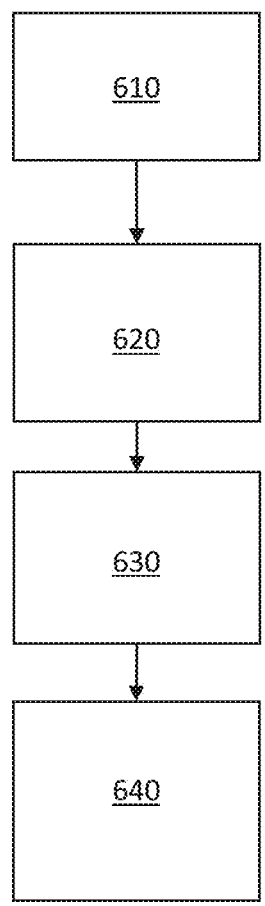
FIG. 6 shows a flow chart illustrating a method for controlling a field effect transistor phase shifter in a radar system according to another exemplary embodiment.

Turning now to FIG. 6, a flow chart illustrating an exemplary implementation of a method 600 for shifting a phase of a radar signal in a radar array is shown. The method is first operative to receive the radar signal at a source of the field effect transistor 610. The radar signal may be received from a radar array antenna via an amplifier and other analog signal processing components, such as band pass filters, mixers, and the like. Alternatively, the radar signal may be received from a radar signal processor and wherein the method is configured to condition the radar signal before transmission via a radar array antenna. In one exemplary configuration, the magnitude of the radar signal may be adjusted by a preamplifier and coupling the radar signal to the source.

The method is next operative for applying a first variable voltage to a gate of the field effect transistor 620. The first variable voltage applied to the gate may have the effect of opening a conduction path between the source and the drain such that the radar signal may be coupled between the source and the drain.

The method is next operative for applying a second variable voltage to a back gate well control 630 such that the phase of the radar signal is adjusted to a desired phase. In this example, varying the second variable voltage may vary a drain to body capacitance between the drain and a substrate on which the field effect transistor is formed. In one embodiment, the second variable voltage may be applied to the back gate well control via a switched DC bias source.

Next, the method is configured for transmitting the radar signal having the desired phase from a drain of the field effect transistor to a subsequent state of the radar signal processing path 640, such as an amplifier, mixer, or the like. In one embodiment, the magnitude of the radar signal having the desired phase may be adjusted by an amplifier and the radar signal may then be coupled to a radar antenna.

In one exemplary configuration, the method is configured for altering a phase of a radar signal by a field effect transistor formed on a substrate wherein the field effect transistor is formed on an insulator well formed within the substrate. The insulator well may further have an insulator well to substrate capacitance forming a portion of a drain to substrate capacitance. Varying the second variable voltage applied at the back gate well control may the alter the insulator well to substrate capacitance and thereby alter the phase response of the field effect transistor on the radar signal.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed in:

1. A radar array comprising:
a gate bias source configured for providing a first variable voltage;
a back gate bias source configured for providing a second variable voltage; and
a field effect transistor having a drain, a source, a gate and a back gate well control, the field effect transistor configured to couple an alternating current radar signal between the drain and the source and to adjust a phase of the alternating current radar signal in response to the first variable voltage being applied to the gate and the second variable voltage being applied to the back gate well control.

2. The radar array of claim 1 further including a substrate and wherein the field effect transistor is formed within the substrate and wherein the field effect transistor has a drain to body capacitance between the drain and the substrate and wherein adjusting the first variable voltage and the second variable voltage modifies the drain to body capacitance.

3. The radar array of claim 1 further including a preamplifier configured for adjusting a magnitude of the alternating current radar signal and configured for coupling the alternating current radar signal to the source.

4. The radar array of claim 1 further including an amplifier configured for receiving the radar signal from the drain, adjusting a magnitude of the radar signal and configured for coupling the radar signal to a radar antenna.

5. The radar array of claim 1 wherein the radar array includes a plurality of antennas and wherein each of the plurality of antennas is coupled to a respective one of a plurality of phase shifters.

6. The radar array of claim 1 wherein the alternating current radar signal is a millimeter wave radar signal.

7. The radar array of claim 1 further including an insulator well formed between the field effect transistor and a substrate and wherein the insulator well has an insulator well to substrate capacitance forming a portion of a drain to substrate capacitance and wherein the second variable voltage applied at the back gate well control alters the insulator well to substrate capacitance.

8. The radar array of claim 1 wherein the second variable voltage is applied to the back gate well control via a radio frequency choke resistor.

9. A method of altering a phase of a radar signal by a field effect transistor formed on a substrate comprising:
receiving the radar signal at a source of the field effect transistor;
applying a first variable voltage to a gate of the field effect transistor;
applying a second variable voltage to a back gate well control such that the phase of the radar signal is adjusted to a desired phase to generate an adjusted radar signal; and
transmitting the adjusted radar signal having the desired phase from a drain of the field effect transistor.

10. The method of altering a phase of a radar signal by a field effect transistor formed on a substrate of claim 9 wherein varying the second variable voltage varies a drain to body capacitance between the drain and the substrate.

11. The method of altering a phase of a radar signal by a field effect transistor formed on a substrate of claim 9 further including adjusting a magnitude of the radar signal by using a preamplifier and coupling the radar signal to the source by using the preamplifier.

12. The method of altering a phase of a radar signal by a field effect transistor formed on a substrate of claim 9 further including adjusting, by using an amplifier, a magnitude of the adjusted radar signal and coupling the adjusted radar signal to a radar antenna by using the amplifier.

13. The method of altering a phase of a radar signal by a field effect transistor formed on a substrate of claim 9 wherein the field effect transistor is one of a plurality of field effect transistors and wherein the plurality of field effect transistors form a portion of a radar array.

14. The method of altering a phase of a radar signal by a field effect transistor formed on a substrate of claim 9 wherein the radar signal is a millimeter wave radar signal.

15. The method of altering a phase of a radar signal by a field effect transistor formed on a substrate of claim 9 wherein the field effect transistor is formed on an insulator well formed within the substrate and wherein the insulator well has an insulator well to substrate capacitance that forms a portion of a drain to substrate capacitance and wherein the second variable voltage applied at the back gate well control alters the insulator well to substrate capacitance.

16. The method of altering a phase of a radar signal by a field effect transistor formed on a substrate of claim 9 wherein the second variable voltage is applied to the back gate well control via a switched DC bias source.

17. A solid state radar array comprising:
a first radar signal channel including a first antenna, a first amplifier, and a first bandpass filter; and
a second radar signal channel including a second antenna, a second amplifier, a second bandpass filter, and a phase shifter wherein the phase shifter includes a field effect transistor having a drain, a source, a gate and a back gate well control, the field effect transistor being configured to couple a first alternating current radar signal between the drain and the source and to adjust a phase of the first alternating current radar signal in response a first variable voltage from a gate bias source applied to the gate and a second variable voltage from a back gate control source applied to the back gate well control..

18. The solid state radar array of claim 17 wherein the first antenna is configured to receive a second alternating current radar signal and the second antenna is configured to receive the first alternating current radar signal and wherein the phase shifter is configured to adjust the phase of the first alternating current radar signal to match a phase of the second alternating current radar signal.

19. The solid state radar array of claim 17 wherein the first antenna is configured to transmit a second alternating current radar signal and the second antenna is configured to transmit the first alternating current radar signal and wherein the phase shifter is configured to adjust the phase of the first alternating current radar signal to alter a directivity of the solid state radar array.

20. The solid state radar array of claim 17 wherein the first amplifier, the first bandpass filter; the second amplifier, the second bandpass filter and the phase shifter are formed as an integrated circuit.

* * * * *